(12) United States Patent
Rokos

(10) Patent No.: US 8,022,789 B2
(45) Date of Patent: Sep. 20, 2011

(54) TUNING CONTROL ARRANGEMENT

(76) Inventor: George Hedley Storm Rokos, Little Sampford (GB)

( * ) Notice: Subject to any disclaimer, the term of this patent is extended or adjusted under 35 U.S.C. 154(b) by 519 days.

(21) Appl. No.: 11/887,836

(22) PCT Filed: Oct. 17, 2005

(86) PCT No.: PCT/GB2005/004002
§ 371 (c)(1),
(2), (4) Date: Oct. 4, 2007

(87) PCT Pub. No.: WO2006/106279
PCT Pub. Date: Oct. 12, 2006

(65) Prior Publication Data
US 2008/0186114 A1 Aug. 7, 2008

(30) Foreign Application Priority Data
Apr. 5, 2005 (GB) .................................. 0506887.9

(51) Int. Cl.
*H03H 7/075* (2006.01)

(52) U.S. Cl. ........................................ 333/174; 333/175

(58) Field of Classification Search ................ 334/6, 15;
331/158, 177 R, 177 V, 178, 179; 333/234,
333/235, 174–176, 185, 205, 207, 209, 223,
333/231
See application file for complete search history.

(56) References Cited

U.S. PATENT DOCUMENTS

| | | | |
|---|---|---|---|
| 3,639,827 A | 2/1972 | Behlen | |
| 5,739,730 A | 4/1998 | Rotzoll | |
| 6,172,378 B1 | 1/2001 | Hull et al. | |
| 6,825,785 B1 | 11/2004 | Huang et al. | |
| 2001/0020875 A1 | 9/2001 | Jansson | |
| 2002/0014925 A1 | 2/2002 | Ochiai | |
| 2003/0164743 A1 | 9/2003 | Gomez et al. | |
| 2004/0012450 A1 | 1/2004 | Nguyen | |
| 2004/0183610 A1 | 9/2004 | Seppinen et al. | |
| 2005/0088249 A1 | 4/2005 | Oehm et al. | |
| 2007/0052488 A1* | 3/2007 | Kasahara et al. | 331/16 |

FOREIGN PATENT DOCUMENTS

DE  102 09 517 A1  6/2003
(Continued)

OTHER PUBLICATIONS

Definition of the word "star", 2011, www.merriam-webster.com.*
Definition of the word "star", 2011, www.dictionary.com.*

*Primary Examiner* — Benny Lee
*Assistant Examiner* — Gerald Stevens
(74) *Attorney, Agent, or Firm* — Young & Thompson

(57) ABSTRACT

A tuning arrangement for a resonant circuit, the tuning arrangement having an output reactance dependent upon a plurality of input applied signals one of which is an input tuning signal, and including: an array of tuning circuits connected in a network whose output reactance is used to control the resonance frequency of the resonant circuit, each tuning circuit having a control input and having a reactance which varies in dependence upon the value of a control signal applied to the control input; elements for generating a plurality of different control signals for application to the control inputs of the tuning circuits; and each such control signal varying substantially linearly with the input tuning signal throughout a predetermined range specific to that control signal, so that the frequency response of the resonant circuit to the input tuning signal is substantially linear throughout a desired range of the input tuning signal.

18 Claims, 14 Drawing Sheets

FOREIGN PATENT DOCUMENTS

| | | |
|---|---|---|
| EP | 1 437 829 A1 | 7/2002 |
| GB | 2 339 984 A | 2/2000 |
| GB | 2 363 923 A | 1/2002 |
| GB | 2 369 259 A | 5/2002 |
| GB | 2 408 400 A | 5/2005 |
| GB | 2 411 061 A | 8/2005 |

* cited by examiner

TUNING CONTROL ARRANGEMENT

FIELD OF THE INVENTION

The present invention relates to an arrangement and a method for generating an input signal for a tunable circuit such as an oscillator, resonator or filter circuit.

BACKGROUND OF THE INVENTION

Many frequency controlled tunable circuits, such as oscillator or filter circuits, have non-linear frequency output characteristics, that is, the frequency output vs. control (current or potential) characteristic is not always linear. When good linearity is desired, oscillator designers typically select component types and apply resonant effects to achieve a characteristic that meets the requirement as nearly as possible. Sometimes it is not possible or practical to achieve the desired linearity and system designs need to be modified. Even when linearity is achievable, component and dimension tolerances can require either that components are individually selected following device tests, or that physical adjustments are made during the manufacturing process. This obviously increases production costs.

In some applications, absolute control rate can be important. Temperature dependencies can limit the final system performance, or require that an otherwise low-power system be placed in a temperature controlled environment, such as an oven.

A constant frequency tuning rate can be important for systems such as temperature compensated crystal oscillators, to avoid degradation of frequency accuracy when the oscillator is tuned away from the conditions under which it was compensated. Such tuning may be necessary to correct for, for example, ageing of the quartz crystal, or to match the operating environment. One situation where this is particularly relevant is in retiming circuits where a local crystal oscillator tracks an intermittent input clock with a frequency that is allowed to deviate from a nominal value. To ensure a rapid recovery from loss of input clock signal, the local crystal oscillator is required to continue oscillating at the last observed frequency for extended periods.

Communication, navigation, and timing systems often need to synchronise their local frequency sources to a remote reference. It is helpful for the control of this synchronisation for the tuning rate of the local source to be constant—i.e. linear and independent of temperature. These same characteristics are beneficial for maintaining constant frequency output from temperature compensated oscillators after the oscillator has been re-tuned. Suitable resonators for such oscillators can include acoustic devices such as bulk-mode crystals and SAWs, dielectric resonators such as ceramic pucks and cooled sapphire and hybrid arrangements.

There is thus a need to provide for a more linear tuning rate for such systems, and/or for the tuning rate to be matched for individual oscillators or resonators and/or to provide compensation for typical temperature variations in oscillator output.

In GB 2369259 some tuning linearity and temperature corrections can be achieved using a circuit which provides a predistorted control signal. While the method of predistortion in GB 2369259 was capable of providing tuning characteristics with excellent linearity and temperature independence, it can prove difficult to maintain fast response and low noise while minimizing the circuit's dissipation. The present invention can provide an alternative and improved way of achieving linearity and temperature correction.

BRIEF SUMMARY OF THE INVENTION

According to one aspect of the invention there is provided a tuning arrangement for a resonant circuit, the tuning arrangement having an output reactance dependent upon a plurality of input applied signals one of which is an input tuning signal, and comprising:

an array of tuning circuits connected in a network whose output reactance is used to control the resonance frequency of the resonant circuit, each tuning circuit having a control input and having a reactance which varies in dependence upon the value of a control signal applied to the control input;

means for generating a plurality of different control signals for application to the control inputs of the tuning circuits; and each such control signal varying substantially linearly with the input tuning signal throughout a predetermined range specific to that control signal, so that the frequency response of the resonant circuit to the input tuning signal is substantially linear throughout a desired range of the input tuning signal.

A corresponding method of tuning a resonant circuit is provided in which an input applied signal is split to generate a plurality of individual control signals of different values, each different individual control signal is applied to a control input of a tuning circuit in an array of tuning circuits, each of whose output reactance varies in dependence upon the value of the control signal applied to its control input.

This method may use the tuning arrangement of the first aspect and can be used for tuning a quartz crystal oscillator.

The network of tuning circuits may be a parallel network.

Preferably means are provided for applying a plurality of input signals to adjust any second and third order nonlinearities in the tuning of the arrangement. The number of input signals required is less than the number of tuning circuits in the array. The input signals may be independent of each other and may be modified using pre-set values for example as a function of temperature to correct for temperature dependence of a circuit to be tuned.

The means for generating the or each control signal may comprise a passive bias network, such as a potential divider arrangement comprising an array of resistors.

In one embodiment the potential divider arrangement comprises a ladder formed by resistors arranged in two series chains of resistors forming the sides i.e. the uprights of the ladder with a parallel array of resistors interconnecting corresponding nodes in the two series chains forming rungs of the ladder. Output would be taken from one side or upright of the ladder. Resistor values may be determined such that control potentials applied to the feet and the tips of the ladders serve to adjust the frequency offset, the sensitivity, and the second and third order coefficients of the tuning law.

The values of the resistors in the sides and the rungs could be made similar to each other such that with N rungs in the ladder, the values of the individual rungs would be in the order $N^2$ larger than the individual resistors in the sides.

Alternatively the divider arrangement may comprise two stars of resistors with corresponding points joined to each other, and adjacent points additionally joined via a chain of resistors.

According to a preferred embodiment the tuning circuits comprise variable reactance elements such as MOS varactors arranged in pairs electrically connected back-to-back at nodes with one terminal of the first element of each pair being electrically connected to the equivalent terminal of the second element of the same pair. Each individual control voltage is applied at the node between a respective one of the pairs of variable reactance elements.

Embodiments of the invention have the advantages of minimizing sensitivity to drift in the control characteristic of the variable reactance elements, linearizing tuning, maintaining tuning rate and linearity with temperature, and allowing the linearity and the tuning rate to be adjusted variably over temperatures.

The invention may also serve to compensate for the effect of drift in the control characteristics of individual tuning devices. The arrangement can also minimize the sensitivity to variability in control requirements. This is because the individual tuning circuits are taken relatively rapidly through the most sensitive parts of their tuning characteristics. In addition, in an arrangement of the invention where all control signals have the same gradient, errors due to uniform shifts in the responses (of the tuning circuits to the control signals) can be corrected by a signal- and temperature-invariant shift of the input tuning signal. Such shifts are those of the control signal (required for any specific output) that are the same for all tuning circuits and are independent of signal level and of temperature; such shifts are experienced by MOSFET varactors under the action of radiation—or of long-term aging, for example.

The tuning system of the present invention may thus be matched to the properties of different resonators and oscillators, both by type and individually.

The invention may also be used for maintaining the tuning rate of some types of R-C and ring oscillator arrangements, as well as of analogue filters.

This invention may be used in combination with some methods of the prior art such as predistortion and the switched connection of different devices for different circuits to provide further improvements in the tuning rate, especially at the extreme of the available control range.

Thus the invention provides for controlling and adjusting the level of offset between tuning signals applied to individual tuning devices, and for applying different gains between the input tuning signal and the individual control signals applied to each tuning element.

In a general aspect the invention provides for applying several signals that are linearly dependent on an input signal as control signals to an array of non-linear tuning circuits and the assembly is used to tune the resonance frequency of an electronic circuit. The characteristics of the tuning components (eg device areas if the tuning circuits are MOS varactors), and the responses of the control signal to the input signal are arranged so that the resonance frequency of the circuit depends substantially linearly on the input signal.

DESCRIPTION OF DRAWINGS

For a better understanding of the present invention and to show how the same may be carried into effect, reference will now be made, by way of example, to the accompanying drawings in which:

FIG. 4b is a graph showing the effect of modifying voltage sources in the circuit shown in FIG. 4a;

DETAILED DESCRIPTION OF PREFERRED EMBODIMENTS

Figure 1:
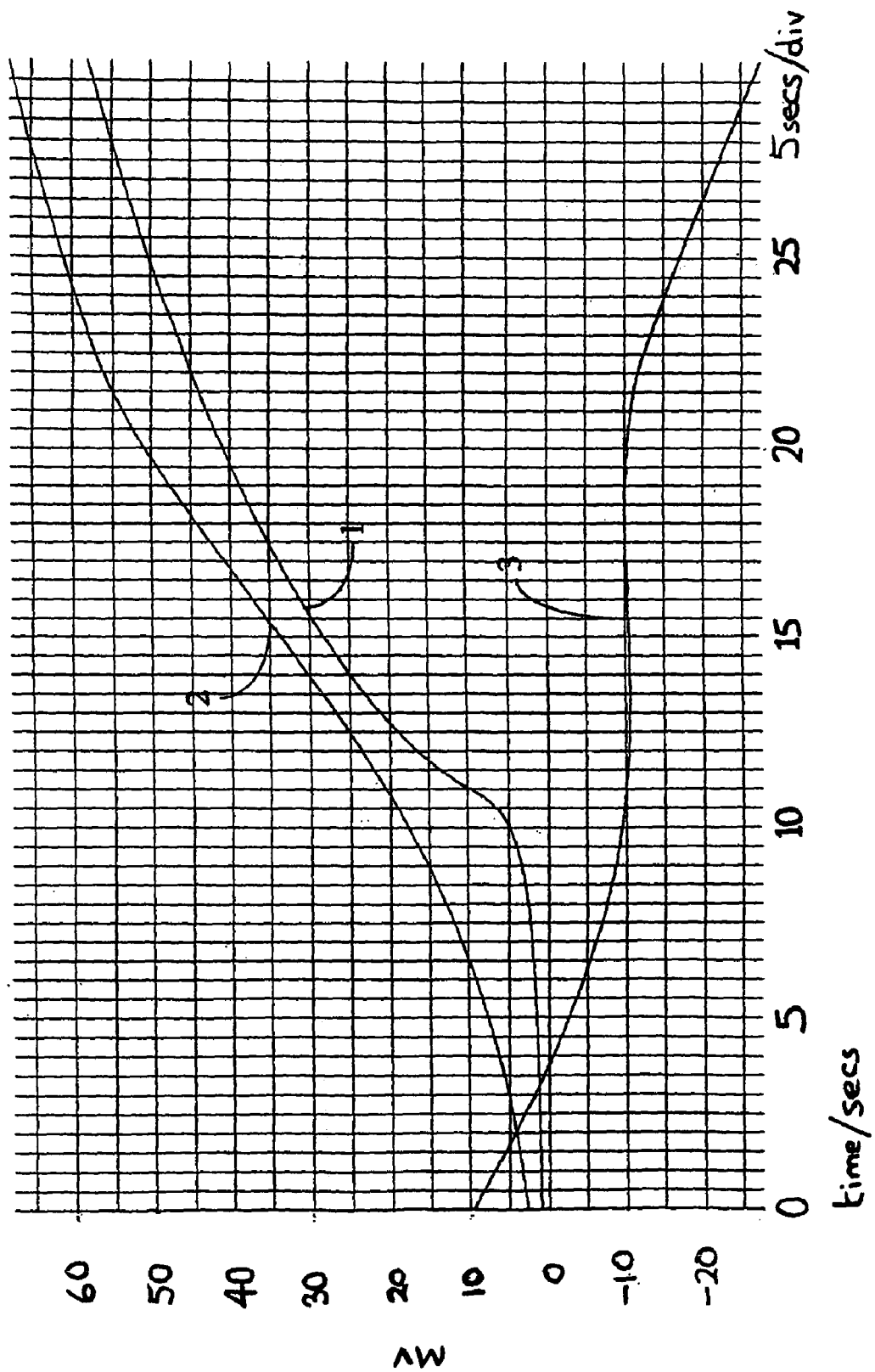
FIG. 1 is a graph showing the reactance characteristics versus applied tuning voltage of a typical MOSFET varactor together with the reactance characteristics of a circuit arranged in accordance with an embodiment of present invention.

FIG. 1 shows how the present invention can be used to create a circuit with improved reactance characteristics when compared to the impedance v bias of a typical MOSFET varactor.

In FIG. 1 curve 1 illustrates the non-linearity of the impedance characteristics of a typical MOSFET varactor. The horizontal axis labelled as time represents a linear voltage sweep. Curve 2 shows how the present invention can provide significantly improved linearity in the impedance characteristics. Curve 3 shows the difference between curve 2 and a linear response, showing that the impedance range over which this arrangement can have linear tuning exceeds a factor of two. Curve 2 shows the impedance of a parallel network of MOS varactors vs the input tuning signal, with one terminal of every MOS varactor being biased to the same input tuning signal, the other terminal of each MOS varactor being biased at a different level that is independent of the input tuning signal.

Figure 2:
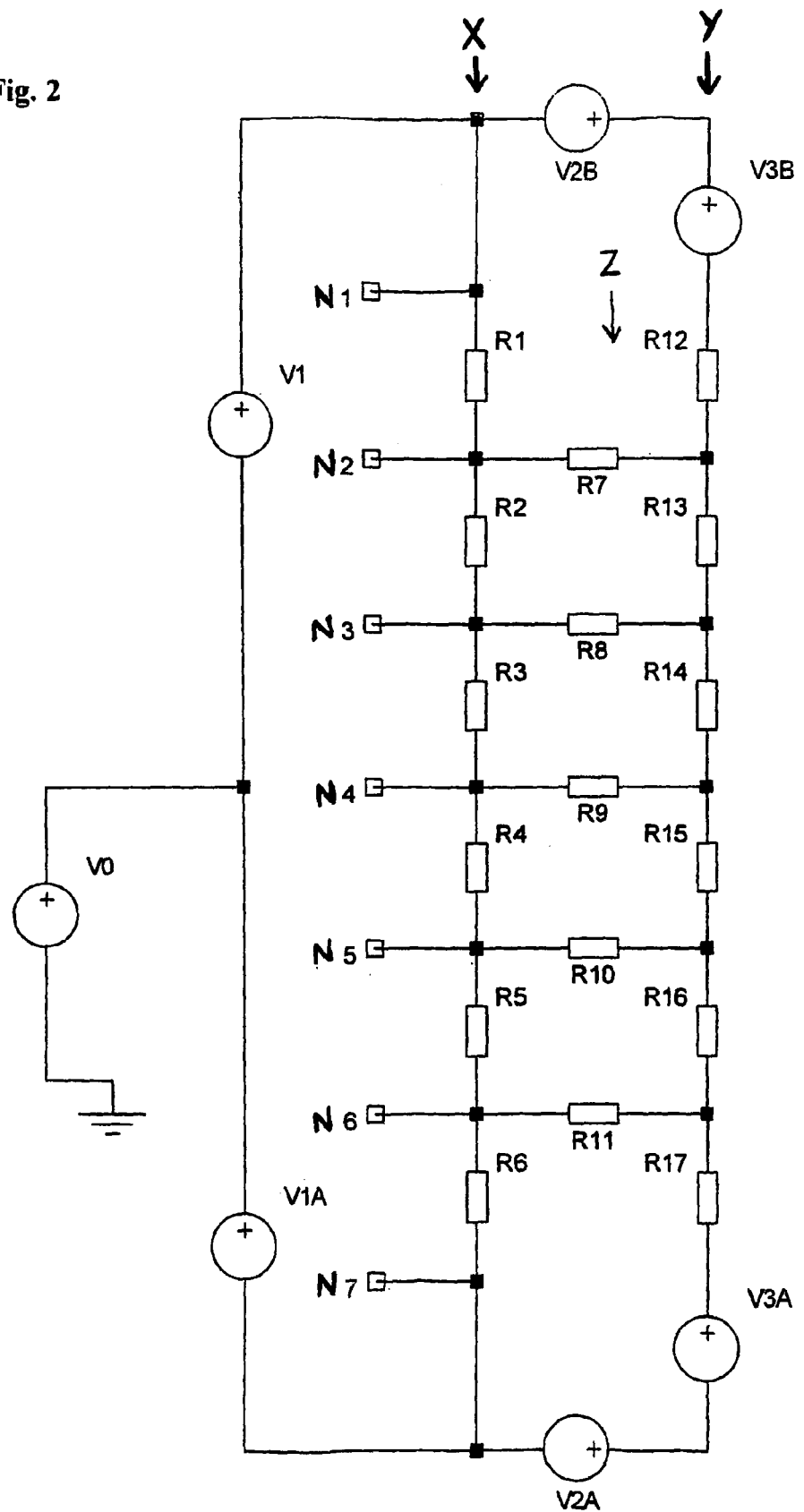
FIG. 2 is a schematic diagram of a circuit that can provide adjustment of different orders of the tuning characteristic, arranged in accordance with one embodiment of the present invention in which DC offset may be adjusted.

In FIG. 2 a potential divider circuit is illustrated comprising an array of resistors R1 to R17 connected in a ladder arrangement. Resistors R1 to R6 are connected in a series chain to form a first side X and resistors R12 to R17 are connected in a series chain to form a second side Y. Resistors R7 to R11 are each connected between the respective resistors of the first and second chains X and Y to form the central rungs Z of the ladder arrangement.

Control signals for variable reactors are derived from the potential at each of nodes N1 to N7 of the first side X. The ladder may be longer or shorter depending upon requirements.

Input applied signals are applied to the feet and tops of the ladder but illustration control potentials V0, V1A, V1B, V2A, V2B, V3A, V3B are shown.

These input applied signal components are independent of the input tuning signal:

Potential V0 serves to apply a fixed offset frequency;

Potentials V1A and V1B are equal, and may be used to adjust the sensitivity of tuning;

Potentials V3A and V3B are equal, and may be used to adjust polynomial components of the frequency response to the input tuning signal up to the second order;

Potentials V3A and V3B are equal, and may be used to adjust polynomial components of the frequency response to the input tuning signal up to the third order.

The "purity" of the adjustment will depend on the values of the resistors and the sizes of the variable reactors; and the third-order adjustment will inevitably affect nominal sensitivity. As the input tuning signal independent potential components on the control ports locally affects the inverse of the tuning sensitivity, higher order components will be increasingly present as the adjustment increases (except zero and possibly first order).

However, control voltage components will not necessarily be independent of the input tuning signal. For example, the tuning range can be increased by making V0 dependent on the input tuning. An extension of adjustment to the fourth order may be achieved by applying a component that is (linearly) dependent on the input tuning signal to V3A and V3B.

If adjustment is only required up to the second order, this may be achieved using a simple resistor chain (i.e. omitting R7, R8 . . . and V2A, V2B . . .), and applying a component that is (linearly) dependent on the input tuning signal to V1A and V1B.

Thus the circuit of FIG. 2 provides for adjustment of different orders of the tuning characteristic. Extension to higher orders is straightforward, for example, by generating input tuning signal-independent components that have second and higher order dependence on their position in the resistor chain on the right side of the diagram. This may be achieved, for example, by attaching further half-ladders to the right hand side of the ladder to create a rectangular grid of resistors. Alternatively, fourth order adjustment may be implemented within the present array by including a term that is linearly dependent on the input tuning signal in the V2A and V2B voltage sources. This is just one example of a resistor arrangement that can provide these characteristics. Similar arrangements for adjusting the bias differentials and linearity within such chains can also be useful to modify the references for gradient changes of a piece-wise-linear generator.

Figure 3:
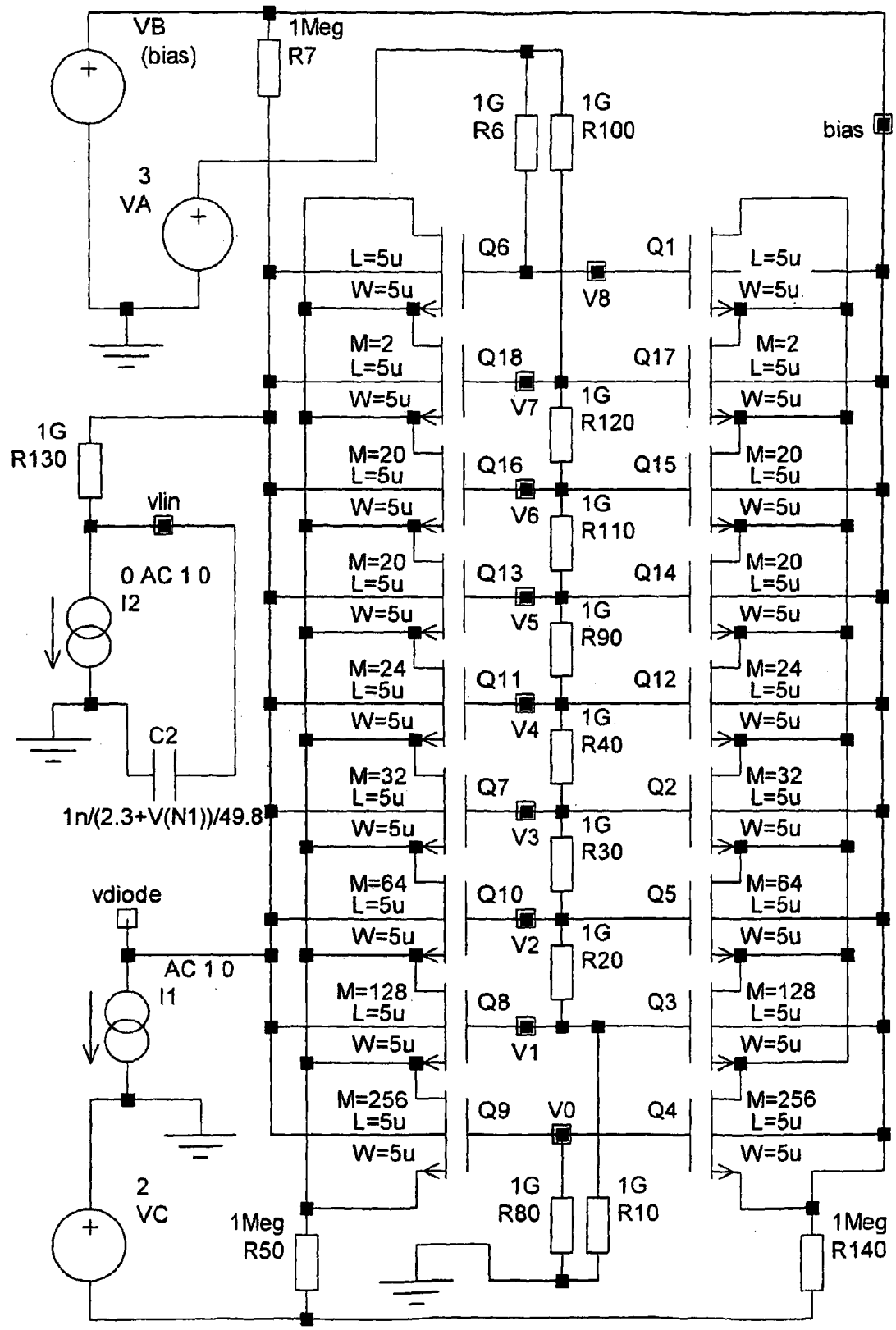
FIG. 3 is a schematic diagram of circuit comprising back-to-back MOSFET varactors according to an embodiment of the present invention.

Individual different potentials are taken from the left hand side of the diagram to form the different value individual control voltages to be applied to variable capacitor elements such as shown in FIG. 3.

FIG. 3 is a circuit diagram showing one possible application of the method of the present invention. The circuit is shown as used for the simulation that generated FIG. 1 and thus includes voltage and current sources $V_{in}$, $I_1$, and $I_2$ and $V_{diode}$ as used to confirm performance during simulations. The circuit comprises a segmented arrangement MOS varactors Q1 to Q18 arranged in a chain of back-to-back pairs. The areas of each of the MOS varactors are indicated by the area multiplier M. In this embodiment the two varactors of each back-to-back pair have the same area as each other but the varactors of different pairs have different areas. Thus, in this example, each of Q1 and Q6 have an area given by a width W of 5 mm and a height H of 5 micrometers, i.e. 25 square micrometers, whereas the adjacent pair of varactors Q18, Q17 has twice this area (M=2) and the next but one pair each has an area of 20 times this area (M=20).

In this particular example the gates of the MOS varactors are biased with uniform separation at the nodes of resistors R10, R20, R30, R40, R90, R110, R120 and R100, as explained below, and a common control signal is applied to the varactor wells from source Vc. Vc is applied to the varactors on the left side of the pairs via a 1 megohm resistor R50 and to the right side via a 1 megohm resistor R140. A voltage bias $V_B$ is applied to the gates of each of the varactors. Under these conditions, a small modulation of the position-dependent bias can cause a change in the modulation function of the MOSFET varactor assembly that has a similar (but normally inverse) characteristic.

The control voltage potentials generated by the divider of FIG. 2, the tuning signals VA, VB and VC and the sizes and characteristics of the varactors determines the impedance which the arrangement presents to the circuit to be tuned, such as an oscillator or filter circuit.

Figure 4A:
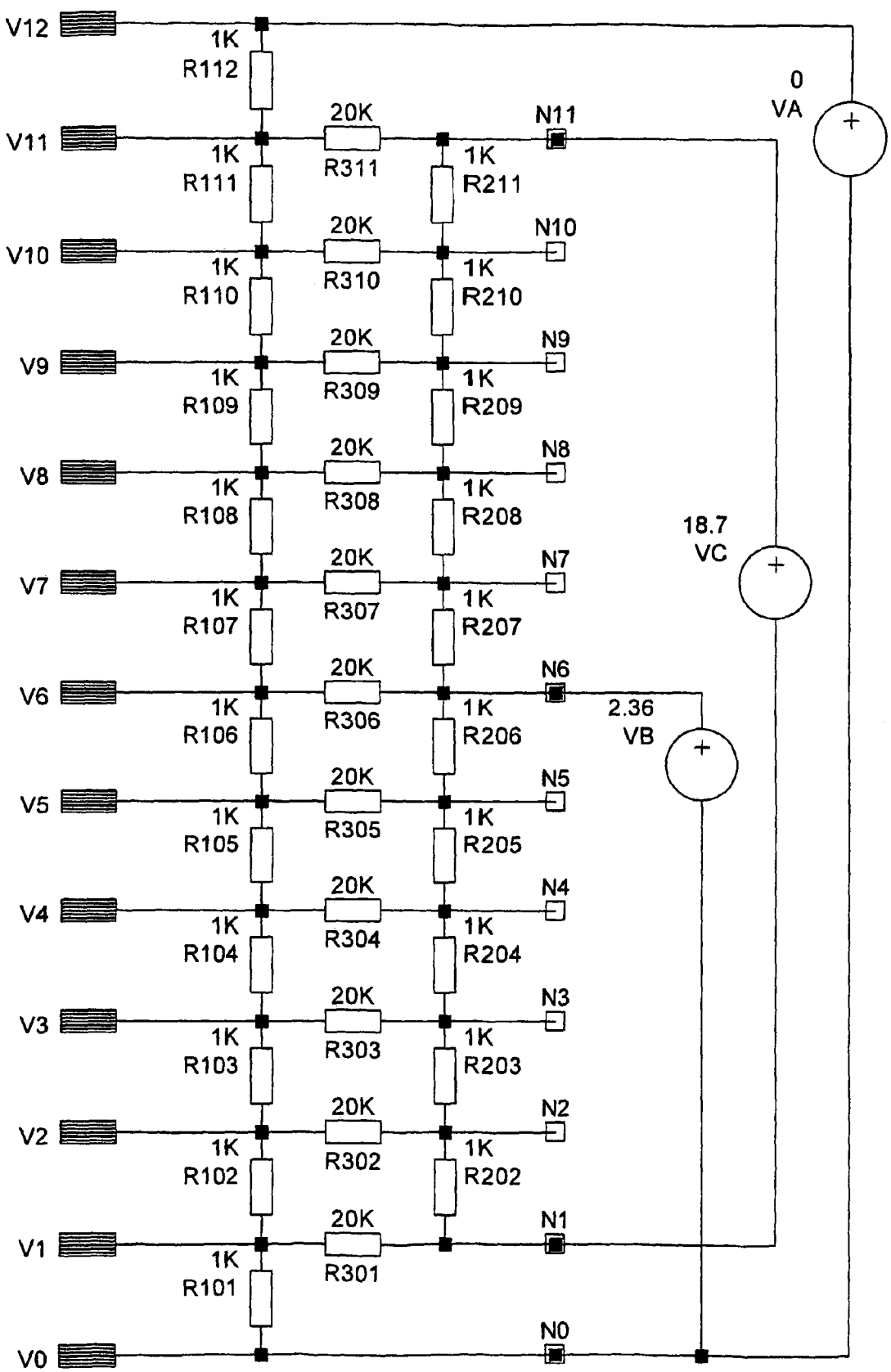
FIG. 4a is a schematic diagram of a circuit for controlling the position-dependent bias on a varactor chain according to an embodiment of the present invention.

FIG. 4a shows a specific example of the general resistor bridge arrangement of FIG. 2, which can be used to control the position-dependent bias on the varactor chain of FIG. 3.

This example of a resistor arrangement comprises a first series chain X of 1kΩ resistors R101 to R112, a second series chain Y of 1kΩ resistors R201 to R211 and an array $Z_1$ of 20kΩ bridging resistors R301 to R311, connecting corresponding 1kΩ resistors in the first and second series chains, as shown.

Each of the outputs at voltage nodes V0 to V12 will be different and dependent upon its position number. Applied voltages are shown at VA, VB and VC, as in FIG. 2. VA is the primary applied voltage applied across the whole bridge array between the node corresponding to $V_0$ and the node corresponding to $V_{12}$. VB is applied between the node $N_0$ corresponding to $V_0$ and the node $N_6$. VC is applied between the node $N_1$ and the node $N_{11}$.

Figure 4B:
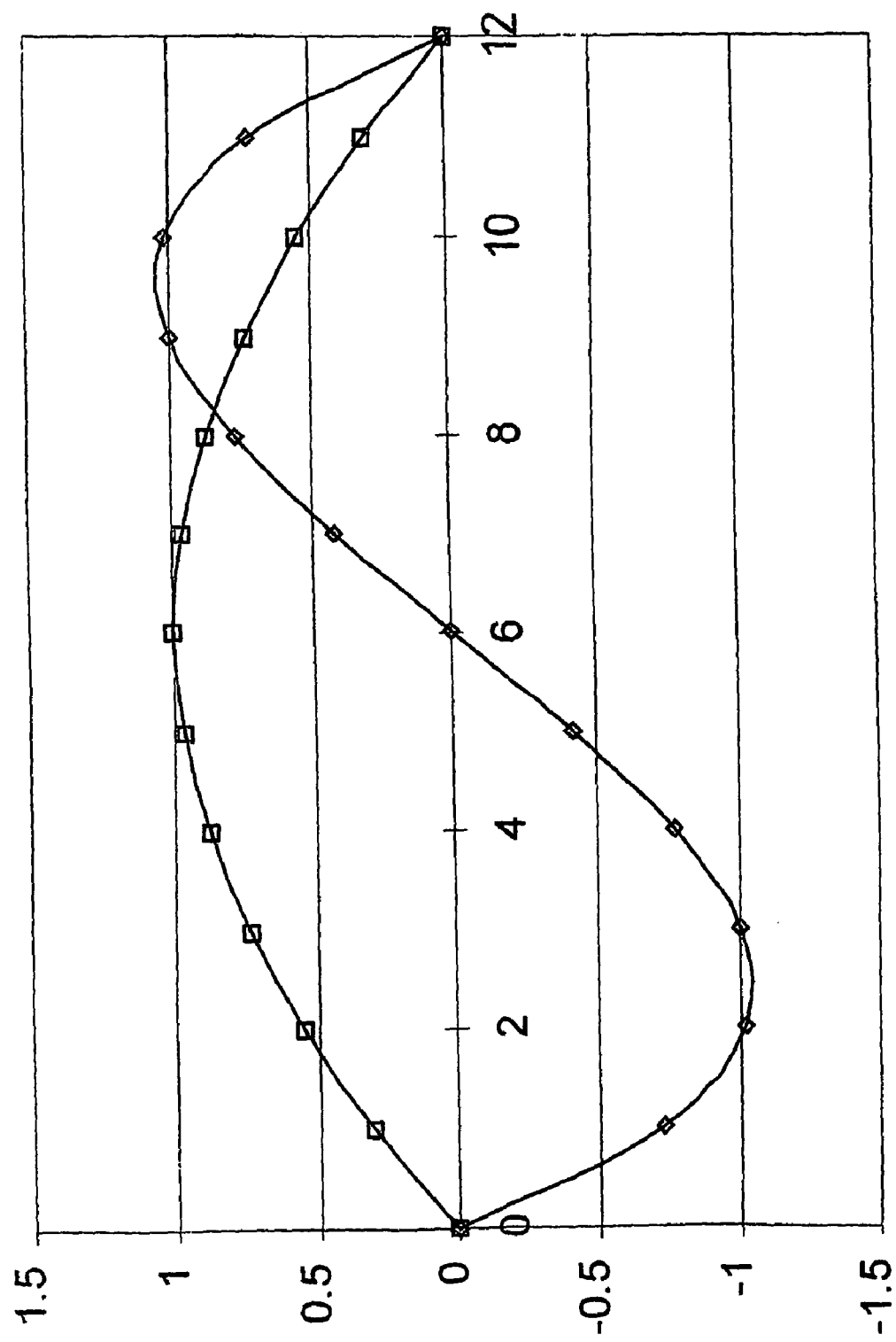

If the voltage VB applied to node N6 is half the primary applied voltage i.e. VB=0.5VA, and voltage source VC applied between nodes N1 and N11 is five sixths of the primary voltage source VA, i.e. VC=5×VA/6 then the potential on the nodes will vary linearly with position number. If source VB is changed from 0.5×VA then it will generate an additional second-order position-dependent term, leaving the bias at voltage nodes $V_0$ and $V_{12}$ unchanged. Similarly, a modification to source VC will generate a third-order position-dependent term that leaves the bias at voltage nodes $V_0$, $V_6$, and $V_{12}$ unchanged. FIG. 4b shows the effect of modifying sources VB and VC respectively by 2.36 and 18.7 volts respectively, and it will be seen that, even for the relatively closely-spaced resistor values of FIG. 4a, the peak distortion of the second-order and third-order terms is only 0.33% and 3.5% respectively. For particularly close tolerance applications this distortion level could be corrected with minor modifications to the resistor values.

Figure 5:
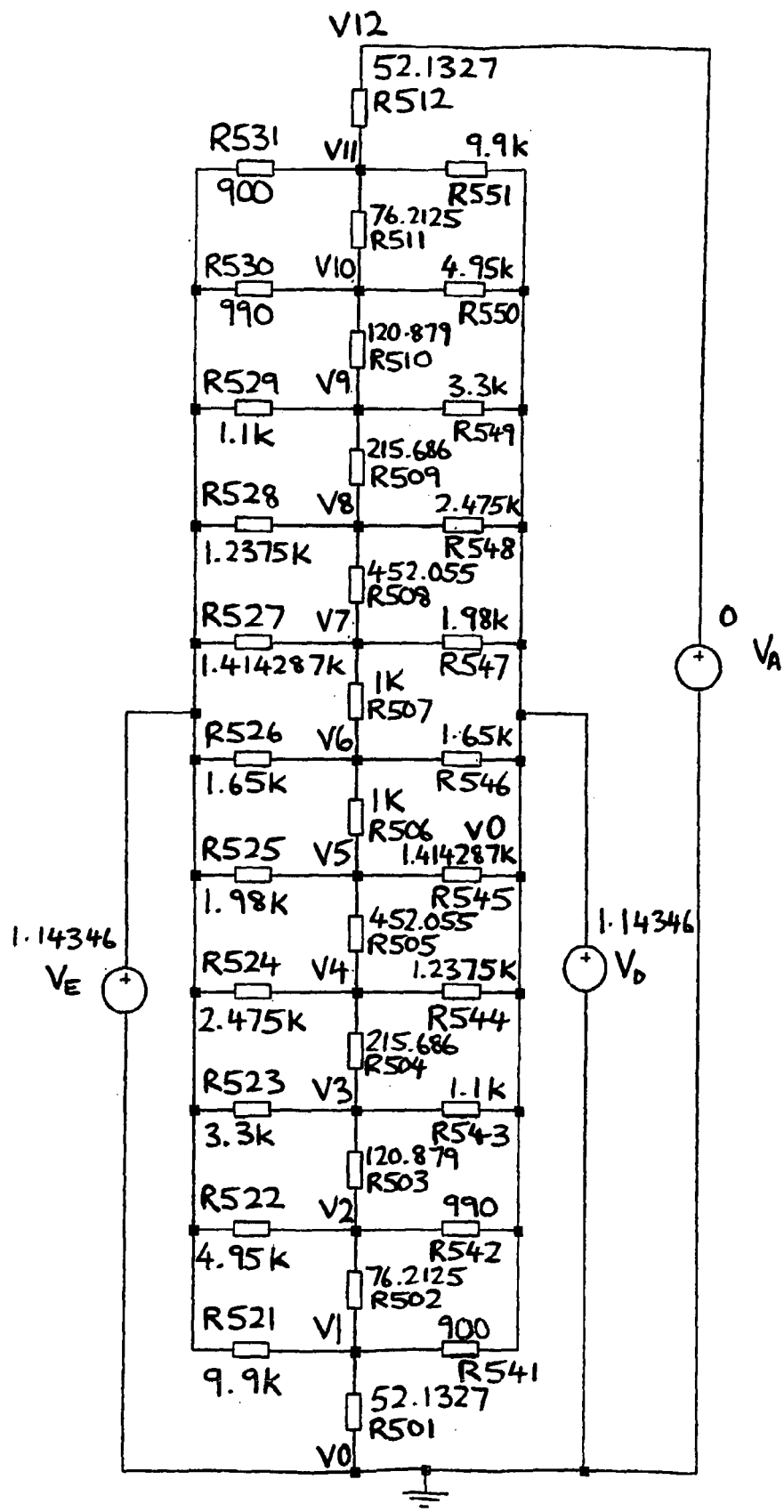
FIG. 5 is a schematic diagram of a circuit comprising an alternative resistor topology for reference chains with adjustable distortion according to an embodiment of the present invention.

FIG. 5 shows an alternative resistor topology to that of FIGS. 2 and 4a. This also is suitable for reference chains with adjustable sensitivity and distortion.

This embodiment comprises a series chain of resistors R501 to R512 biased by the main voltage source VA. Each voltage node $V_1$ to $V_{11}$ between the respective resistors R501 to R512 in the chain is connected to one terminal of each of respective resistors R521 to R531 on one side and R541 to R551 on the other side. The other terminals of resistors R521 to R531 are all connected together to the common source VE and the other terminals of resistors R541 to R551 are all connected together to the common source VD.

In principle, the first, second and third order dependencies of the variation of potential with position may be controlled as follows:

$$VD = V1/2 + V2 + V3$$

$$VE = V1/2 + V2 - V3$$

Where V1 is the linear term, V2 provides even-order terms, and V3 provides odd-order terms. This topology has the advantage of requiring lower dissipation to provide a given output impedance. The disadvantage is that the resistor values are not simply related, which complicates the layout and makes it harder to attain accurate proportional matching. Note that the values presented in FIG. 5 give good performance for the linear term only—further adjustment may be needed to provide low distortion for the even-order and odd-order correction terms to provide low content beyond the third order.

In the embodiments described above, each of the individual MOS varactors generally sees the same input tuning signal change. However it will sometimes be advantageous to drive some of the end sections with more rapid gradients. This may mean that the drive to these end sections needs to become non-linear over some part of the range—but the effect need not be significant if the region of reduced gain coincides with reduced tuning effect from that section. A particular application would be where it is difficult to maintain adequate and uniform tuning right up to the end of the tuning range.

Suitable gradients for use in the invention are illustrated with the graphs of FIGS. 6 to 13 for the case of linearity. In all of FIGS. 6 to 13 the horizontal axis represents the input tuning signal; the vertical axis represents the potentials applied to the MOS varactors' control ports for FIGS. 6, 8, 10, and 12, and the control signal applied to the MOS varactors for FIGS. 7, 9, 11, and 13.

Figure 6:
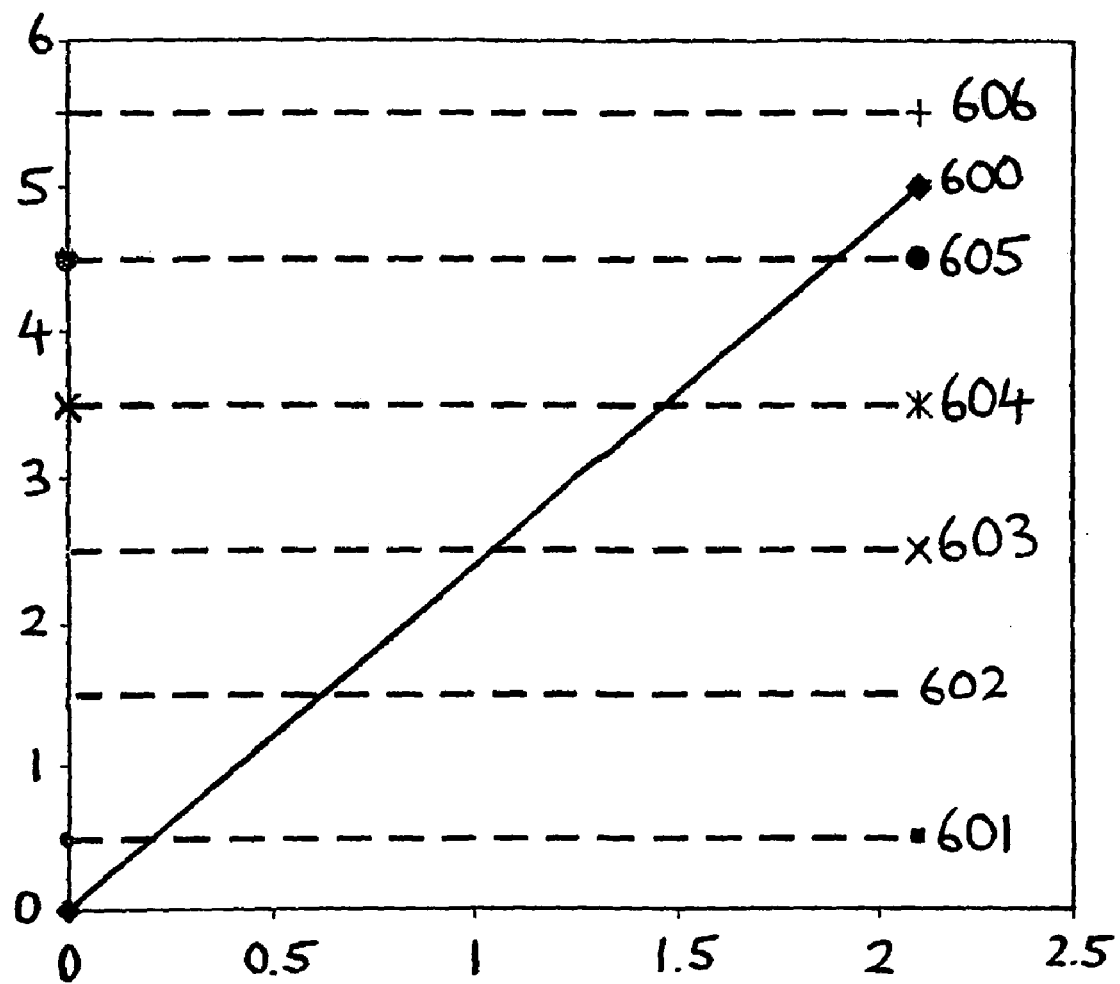
FIGS. 6 to 13 illustrate exemplary control signals applied to the arrangement.

FIG. 6 shows signals which may be applied to the control ports of the tuning circuits, i.e. the MOS varactors in an embodiment in which the control signals are to be independent of the input tuning signals. Signal 600 is applied to one of the ports of each of the tuning circuits and each of signals 601 to 606 are applied to the other port of the respective tuning circuit. As can be seen, signals 601 to 606 are independent of the input tuning signal which is in the range of 0 to 5.1V. The supply range is 0 to 5.5V.

Figure 7:
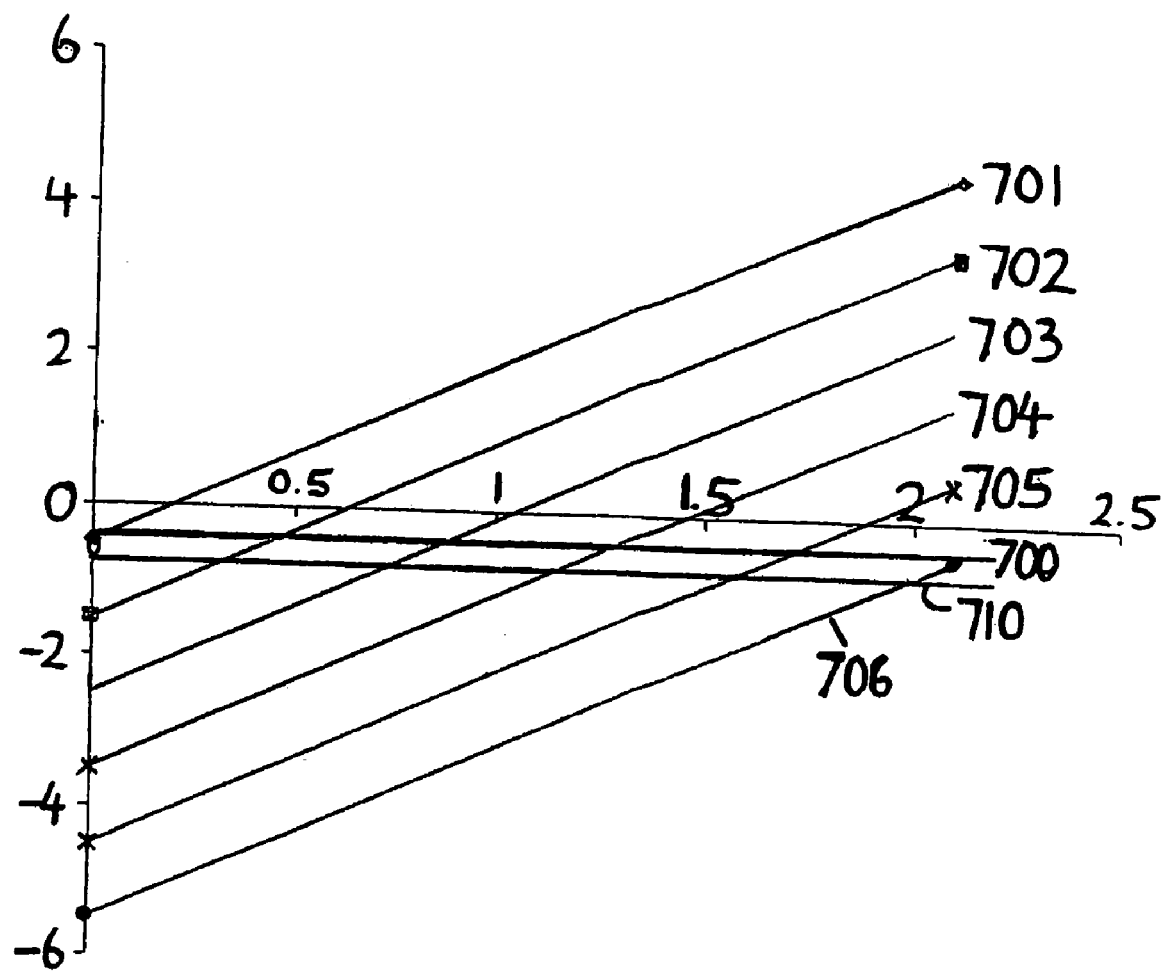

FIG. 7 illustrates the equivalent composite control signals, i.e. the difference between the signals applied to the control ports forming the control input of each tuning circuit. Line 700 represents the approximate signal level region where the tuning sensitivity peaks, whereas line 710 represents the onset of significant tuning sensitivity, i.e. if the signal gradient reduces or becomes zero below this line, it will make little difference to the overall sensitivity.

Figure 8:
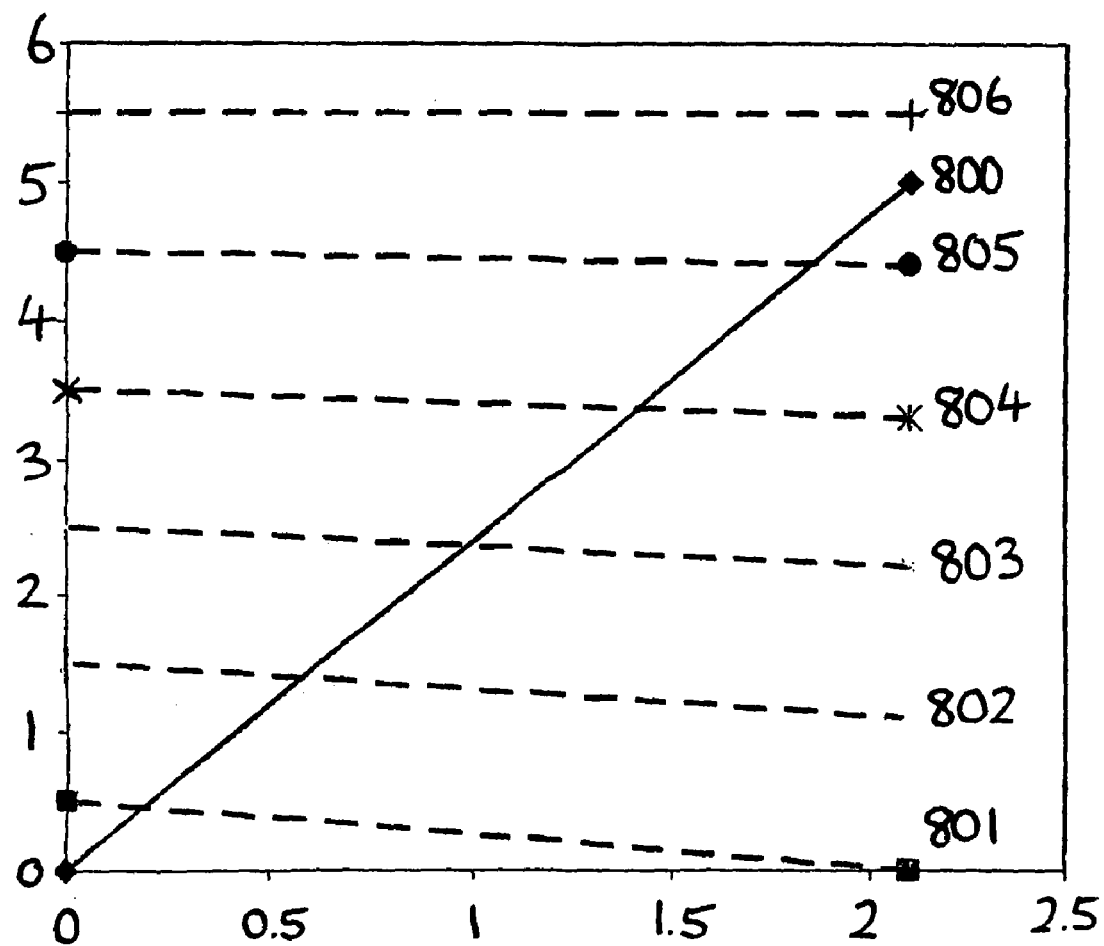
Figure 9:
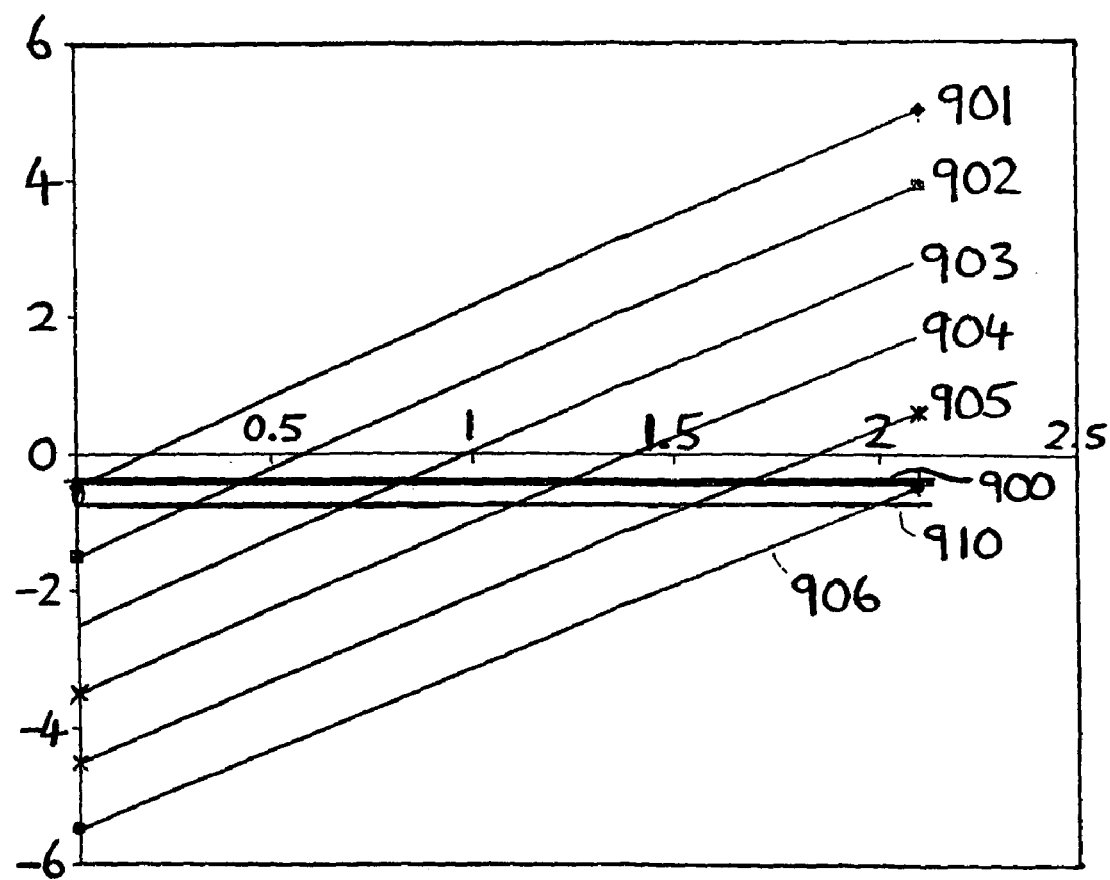

FIGS. 8 and 9 illustrate the signals when signals 801 to 806, are applied to one port of the control input of each of the tuning circuits, and signal 800 is applied to the other input port of each tuning circuit, to produce the composite respective signals 901 to 906. Lines 900 and 910 are equivalent to the lines 700 and 710 in FIG. 7. This increases the tuning range a modest amount.

Figure 10:
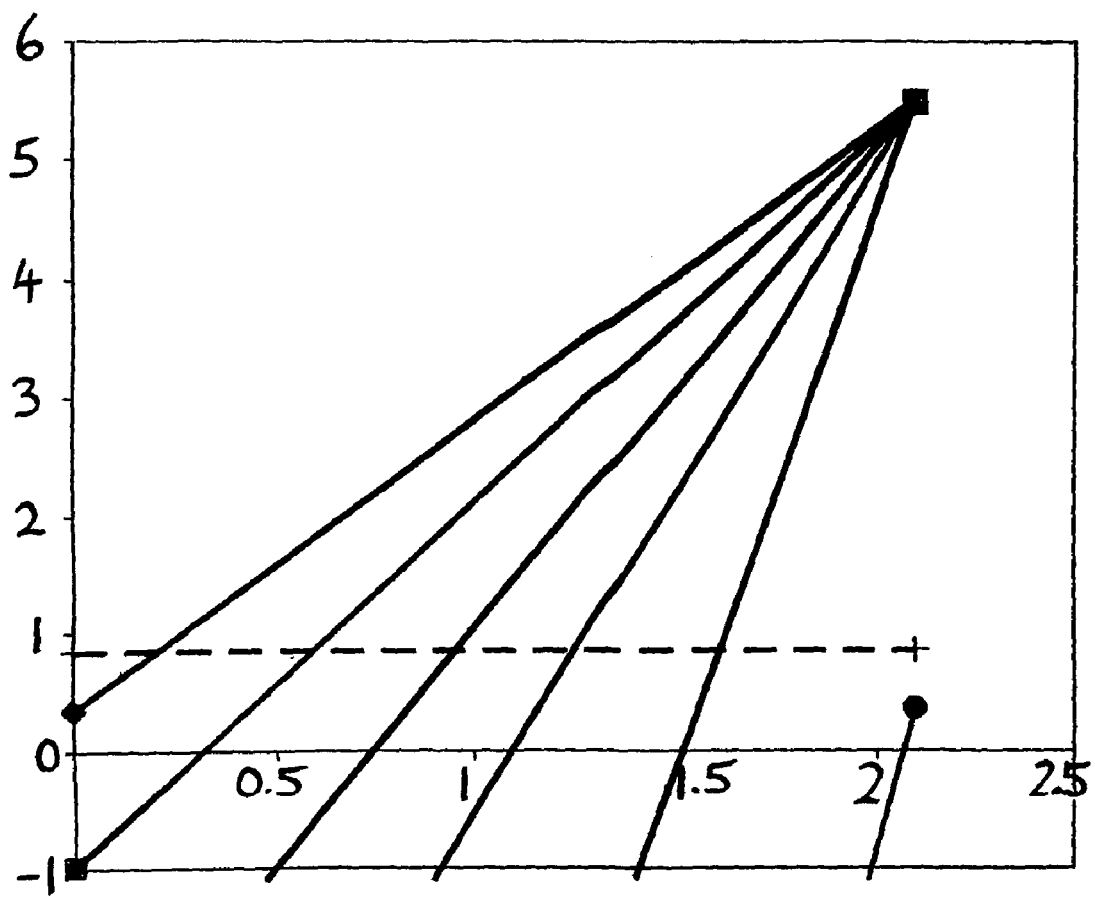
Figure 11:
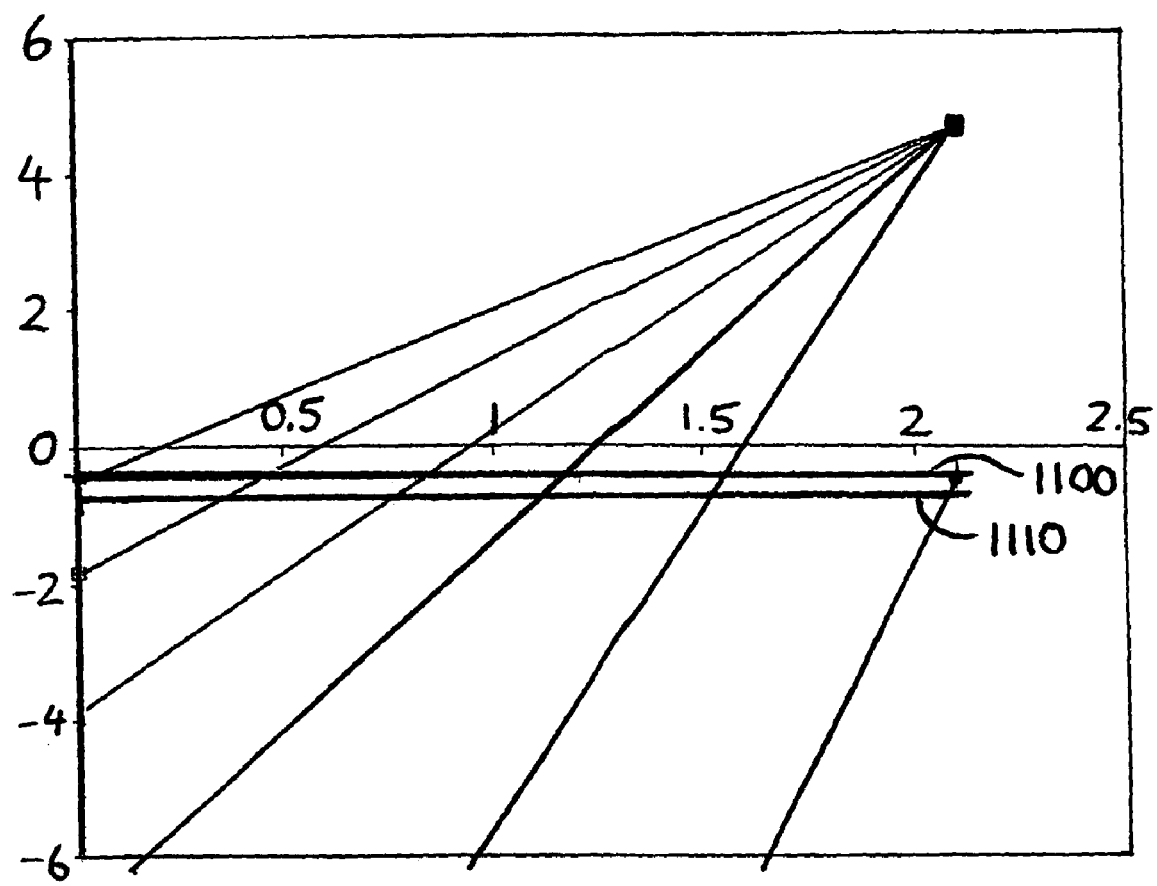

FIGS. 10 and 11 illustrate a single-ended arrangement, with potentials independent of the input tuning signal, which requires limiting when the signal on an input port would otherwise be near or below zero. One port of all the control inputs of the variable reactors is connected to a common terminal of the oscillator, the potential of which is shown by the dashed line. This can explore much of the available control range and provide an input tuning signal dependent control component to the second control port of the majority of the control inputs, except the one with the lowest potential. This increases the control range on most ports by about 0.9V. Lines 1100 and 1110 are equivalent to lines 700 and 710 in FIG. 7. Clearly, such a scheme will provide the maximum linear tuning range that can be achieved using control signals that are linearly dependent on the input tuning signal throughout their active ranges. However, we can see that neither the highest signal shown nor the lowest explore all the useful range between line 110 and the maximum available potential. Thus, we could in principle extend the linear tuning range by allowing the gradients of the control signals with the highest and lowest potentials to become steeper at the ends of the control range.

Figure 12:
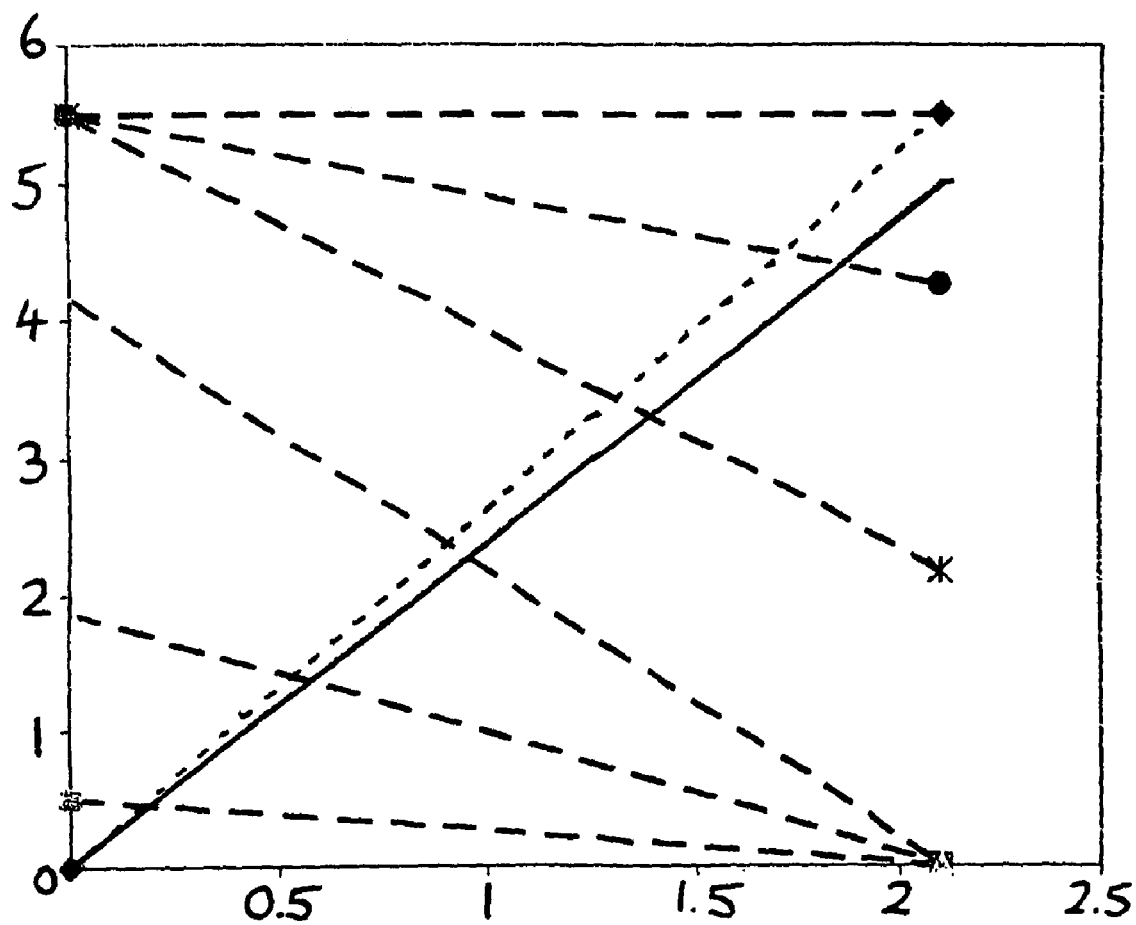
Figure 13:
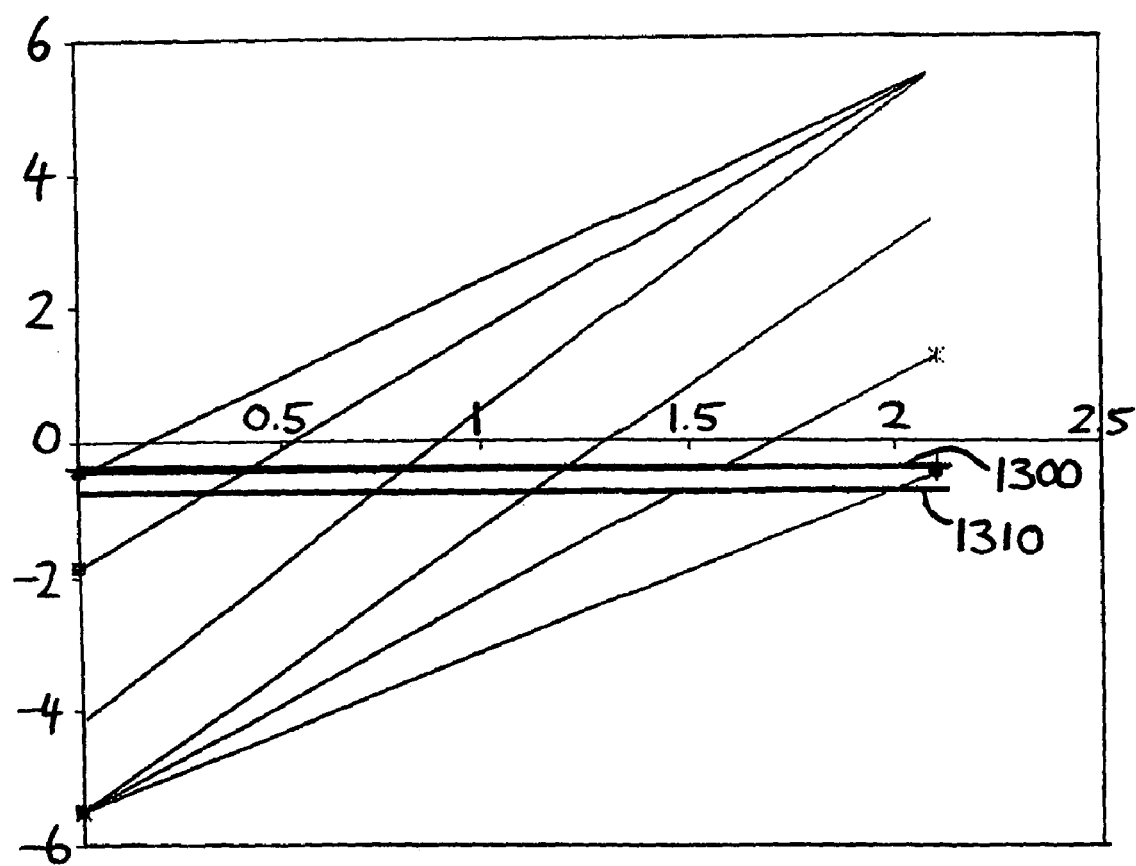

FIGS. 12 and 13 illustrate a double-ended arrangement providing the maximum practical linear tuning range for control signals that are linearly dependent on the input tuning signal throughout the operational range FIG. 12 shows the control potentials applied to the control ports, and FIG. 13 shows the resultant control potentials. Again lines 1300 and 1310 are equivalent respectively to lines 700 and 710 in FIG. 7.

In FIG. 12, the potential exhibiting the steepest positive gradient with respect to the input tuning signal cannot be applied to the port that generates the control signal occupying the lowest position in FIG. 13, as the tuning gradient will undoubtedly reduce once all the control potentials are above line 1300.

In some embodiments of the invention, the tuning circuits have two control ports, such that the effective control signal is the difference between the signals applied to those ports. A single control signal dependent on the input signal is applied to one (same polarity) port of all the tuning circuits. Signals that are independent of the input signal are applied to the other control ports of the tuning circuits. Thus, generation of the control signal from the input signal is relatively straightforward, and distinguished only by a tuning-signal-independent offset between them. This also has some performance advantage.

A variation results in the need to adjust the characteristics to provide a specific sensitivity with adequate linearity. Resistor networks that can provide voltage components that are orthogonal polynomial functions of the connection position of the respective tuning circuit can be developed. Each polynomial function can be modified by varying the potential to a single terminal of the network. This allows the sensitivity and the linearity of the tuning to be conveniently adjusted by applying potentials that are independent of the input signal to the network.

In embodiments using MOS varactors, a typical N-WELL varactor may be used, with the n-well characterised as the positive terminal. For bias below a certain level, the capacitive impedance becomes constant. As the bias rises above a threshold, the capacitive impedance starts to rise. The rate of change of impedance with voltage rapidly reaches a peak, and then relatively gradually diminishes. For higher bias voltages, the impedance varies approximately with the square root of bias voltage.

As far as the RF signal is concerned, groups of MOS varactors are connected in parallel. At one extreme of the input signal, the MOS varactors are biased with one varactor near the peak sensitivity, the others below this point, so that some of them show virtually no change with bias voltage initially. As the voltage rises, and the sensitivity of the first varactor reduces, first one and then the other varactors successively go through their regions of maximum sensitivity. As the last of the varactors approaches its region of maximum sensitivity, the linear tuning range of the arrangement becomes exhausted.

One consequence of this is that the majority of the tuning circuits only see a fraction of the maximum available bias potential, which limits the tuning range.

The two control ports are decoupled at DC from the resonant circuit. For IC use, the decoupling capacitors take up additional space; in addition, their series impedances can have the effect of reducing the effective tuning range. In the present system, an on-chip supply voltage multiplication may be provided to enhance the tuning range.

For applications that require a large tuning capacitance, and are (relatively) easy to tune, an arrangement can be used where one end of the varactor is connected directly to the oscillation circuit, with consequent fixed DC component. The control port for each tuning MOS varactor will be driven with (different) control components that have identical gradients, except that they will limit when the control signal is outside the sensitive range of the tuning circuit.

For some applications a smaller capacitance may be needed and for this a device can be connected as above, but with the control potentials that explore the maximum possible ranges. Another device is then placed in series "back-to-back" with this device; these will see this "maximum excursion" potentials on one port; but control components can be applied with different (reverse) gradients to the other terminal of these additional devices, further extending the control range.

Thus embodiments of the invention can be used to avoid the reduction in available tuning range that can be caused by using series isolation (eg capacitors). Eliminating series capacitors potentially also reduces the die area needed for the circuit.

Preferably the various control circuits can sequentially be brought to their regions of peak sensitivity through the range of the input tuning signal, and the maximum practical tuning range can be explored by ensuring that the gain from the input tuning signal to each control signal is sufficient to explore the available tuning range. Thus, the gain required between the input tuning signal and each control signal will depend on the level of input tuning signal at which its associated tuning circuit reaches its maximum sensitivity.

We can achieve this by modifying the arrangement to apply control components that are dependent on the input tuning signal to the ports that previously used control signals that were independent of the input tuning signal. The dependence would be inverted with respect to the original dependent signal that is applied to the other port. These signals could be applied via the potential divider section that was originally used to set up the non-dependent differentials, such that the tuning circuit that is in its sensitive range throughout the range of the input tuning signal sees the lowest gain, and so on.

In this way the signal on one of the control inputs of each of the tuning circuits is determined by the resonant circuit or oscillator to which it is attached. Effectively, each tuning circuit has a single control input. Because single-ended signals are applied, the control signals cannot be precisely replicated without exceeding the signal ranges that were required.

The invention claimed is:

1. A tuning arrangement for a resonant circuit, the tuning arrangement having an output reactance dependent upon a plurality of input applied signals, one of which is an input tuning signal, the tuning arrangement comprising:
   an array of tuning circuits connected in a network whose output reactance is used to control a resonance frequency of the resonant circuit, each tuning circuit having a control input and having a reactance which varies in dependence upon a value of a control signal applied to the control input;
   means for generating a plurality of control signals for application to the control inputs of the tuning circuits; and
   the control signal for each tuning circuit varying substantially linearly with the input tuning signal throughout a predetermined range specific to that control signal so that a frequency response of the resonant circuit to the input tuning signal is substantially linear throughout a desired range of the input tuning signal,
   wherein the means for generating the plurality of control signals comprises a resistive network in the form of a ladder, wherein the plurality of input applied signals are applied to the top and bottom of the ladder, and the plurality of control signals are derived from potentials on one side of the ladder, resistances in the ladder being arranged such that proportions of the individual input applied signals that are derived at control ports of the ladder result in the creation of adjustments to a tuning response that are polynomial functions of an input tuning signal level, these polynomial functions being quasi-orthogonal functions of a third order or less for the plurality of input applied signals that are independent of the input tuning signal, and application of the plurality of input applied signals that are dependent on the input tuning signal to the top and bottom of the ladder results in a modification to the tuning response that has a power dependency that is one order higher than said third order or less, whereby the tuning response to the input tuning signal can be adjusted and set to be substantially linear.

2. The tuning arrangement according to claim 1, wherein the network is a parallel network.

3. The tuning arrangement according to claim 1, wherein at least one said control input has more than one port, and wherein the one of the plurality of control signals applied to the at least one said control input is dependent upon the input tuning signal.

4. The tuning arrangement according to claim 1, wherein gradients of the substantially linear frequency response of the resonant circuit to the input tuning signal are substantially reduced in a region where a tuning gradient of the resonant frequency with respect to a respective one of the plurality of control signals is small compared with a peak gradient of the resonant frequency with respect to that respective control signal.

5. The tuning arrangement according to claim 1, wherein gradients of the substantially linear frequency response of the resonant circuit to the input tuning signal are substantially the same, each said gradient including the effect of any dependency of the other input applied signals on the input tuning signal.

6. The tuning arrangement according to claim 1, wherein the input tuning signal is developed from a prior tuning signal, the response of the input tuning signal being non-linear with respect to the prior tuning signal for signals outside the range where the tuning response is linear with respect to the input tuning signal, the non-linear response being such as to extend a linear range of the tuning response with respect to the prior input signal.

7. The tuning arrangement according to claim 1, further comprising means for adjusting the input tuning signal using digital information stored in a nonvolatile electronic memory.

8. The tuning arrangement according to claim 7, wherein the adjusting means maintains constancy of an overall tuning response of the resonance frequency to the input tuning signal.

9. The tuning arrangement according to claim 1, further comprising means for adjusting the response of the control signals to any of the plurality of input applied signals using digital information stored in a non-volatile memory.

10. The tuning arrangement according to claim 1, further comprising means for modifying at least one of the input applied signals as a function of temperature to correct for temperature dependence.

11. The tuning arrangement according to claim 1, wherein a number of tuning circuits in the network is substantially more than the plurality of input applied signals.

12. The tuning arrangement according to claim 1, wherein the array of tuning circuits comprise MOS Varactors.

13. The tuning arrangement according to claim 1, wherein a gain from the input tuning signal to at least some of the control inputs is individually pre-adjustable.

14. The tuning arrangement according to claim 1, further comprising means for modifying at least one of the plurality of input applied signals such as to maintain constant tuning frequency response of the resonant circuit to the input tuning signal over the desired tuning range and/or over a desired temperature range.

15. The tuning arrangement according to claim 14, wherein the means for generating the plurality of control signals comprises a distribution network to which the plurality of input applied signals are applied to adjust a relative distribution of gains from the plurality of input applied signals to the plurality of control signals.

16. The tuning arrangement according to claim 15, wherein the resistive network comprises a resistor network having a plurality of control points and having resistor values that are defined so that signals that are linearly dependent signals on the plurality of input applied signals may be applied to the plurality of control points within the resistor network such that one of the plurality of input applied signals adjusts frequency offset, another one of the plurality of input applied signals adjusts at most offset and linear variation of tuning sensitivity with signal level, and that, for each order of response to be adjusted, there is one of said plurality of control points that has a response up to that order, but has substantially no response for higher orders.

17. The tuning arrangement according to claim 16, wherein the adjustment to the linearly dependent signals at the plurality of control points of the resistor network comprise offsets that are independent of the level of the input tuning signal.

18. The tuning arrangement according to claim 16, wherein the linearly dependent signals at the plurality of control points include components that are linearly dependent on a temperature-dependent signal.

* * * * *